United States Patent
Fujioka et al.

(10) Patent No.: US 6,909,644 B2
(45) Date of Patent: Jun. 21, 2005

(54) SEMICONDUCTOR MEMORY DEVICE (75) Inventors: Shinya Fujioka, Kawasaki (JP);
Hitoshi Ikeda, Kawasaki (JP); Masato Matsumiya, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/791,815

(22) Filed: Feb. 26, 2001

(65) Prior Publication Data

US 2001/0017794 A1 Aug. 30, 2001

(30) Foreign Application Priority Data

Feb. 29, 2000 (JP) ........................................ 2000-054831

(51) Int. Cl.[7] .................................................. G11C 7/00
(52) U.S. Cl. .................... 365/196; 365/207; 365/230.06
(58) Field of Search ............................... 365/196, 207, 365/230.06

(56) References Cited

U.S. PATENT DOCUMENTS

| 4,238,841 | A | | 12/1980 | Clemen et al. | |
|---|---|---|---|---|---|
| 4,814,647 | A | | 3/1989 | Tran | |
| 5,091,887 | A | | 2/1992 | Asakura | |
| 5,111,434 | A | * | 5/1992 | Cho | 365/207 |
| 5,661,678 | A | * | 8/1997 | Yoshida et al. | 365/149 |
| 5,754,481 | A | * | 5/1998 | Yabe et al. | 365/189.05 |
| 6,130,849 | A | * | 10/2000 | Kawabata et al. | 365/190 |
| 6,154,404 | A | * | 11/2000 | Hwang | 365/149 |
| 6,160,746 | A | * | 12/2000 | Park et al. | 365/203 |

FOREIGN PATENT DOCUMENTS

| DE | 199 03 198 | 5/2000 |
|---|---|---|
| EP | 0 426 071 A2 | 5/1991 |
| GB | 1 502 334 | 3/1978 |

* cited by examiner

*Primary Examiner*—Van Thu Nguyen
(74) *Attorney, Agent, or Firm*—Arent Fox PLLC (57) ABSTRACT

The present invention provides a semiconductor memory device of a twin-storage type having an operation control method and a circuit structure that achieve a higher process rate, a less power consumption, and a smaller chip area. This semiconductor memory device includes bit lines in pairs, a sense amplifier connected to each pair of the bit lines, a first memory cell connected to one bit line of each pair of the bit lines, a second memory cell that is connected to the other bit line of each pair of the bit lines and stores the inverted data of the data stored in the first memory cell. This semiconductor memory device is characterized by not having means to pre-charge the bit lines to a predetermined potential. The semiconductor memory device of the present invention is also characterized by including a control circuit that controls the sense amplifier to start a pull-down operation after starting a pull-up operation.

7 Claims, 8 Drawing Sheets

SEMICONDUCTOR MEMORY DEVICE

BACKGROUND OF THE INVENTION

1. Field of the Invention

The present invention generally relates to semiconductor memory devices, and, more particularly, to a semiconductor memory device having a cell structure of a twin storage type.

2. Description of the Related Art

In a semiconductor memory device having a twin-storage type cell structure, 1-bit data is stored in a pair of memory cells. One of the memory cells stores an inverted data of the data stored in the other one of the memory cells. For instance, if one of the memory cell stores high-level data, the other one of the memory cells stores low-level data. The pair of memory cells is connected to a pair of bit lines. One of the bit lines is amplified to the high level, while the other one of the bit lines is amplified to the low-level.

The difference in charge accumulated in the two memory cells serves to separate the potentials of the two bit lines, so that a steady data read operation can be performed. For instance, if the potential of the memory cell storing the high-level data is lower than the pre-charge level of the bit line due to electric discharge of the memory cell, the difference between the charges accumulated in the two memory cells separates the two bit lines, so that an accurate data read operation can be performed.

In the above semiconductor memory device of the twin-storage type, a steady and accurate data read operation can be performed. The same control operation as in a conventional semiconductor memory device of a single-storage type, despite the above-mentioned advantages, will result in wastes in terms of the process rate, the power consumption, and the chip area. Accordingly, a control operation that is different from the control operation for the conventional semiconductor memory device of the single-storage type should preferably be performed so as to increase the process rate and to reduce the power consumption and the chip area.

SUMMARY OF THE INVENTION

A general object of the present invention is to provide semiconductor memory devices in which the above disadvantages are eliminated.

A more specific object of the present invention is to provide a semiconductor memory device of a twin-storage type having a control operation method and a circuit structure that increase the process rate and reduce the power consumption and the chip area.

The above objects of the present invention are achieved by a semiconductor memory device which includes: bit lines in pairs; a sense amplifier that is connected to each pair of the bit lines; a first memory cell that is connected to one bit line of each pair of the bit lines; and a second memory cell that is connected to the other bit line of each pair of the bit lines and stores the inverted data of the data stored in the first memory cell. This semiconductor memory device is characterized by not comprising a unit for pre-charging the bit lines to a predetermined potential.

In this semiconductor memory device, no component for pre-charging the bit line to a predetermined potential is employed. However, the semiconductor memory device of the twin-storage type reads out data in accordance with the potential difference between the two memory cells, instead of reading out the difference between the potential of one memory cell and the pre-charge potential as in a case of a conventional single-storage type. Accordingly, a steady and accurate data read operation can be performed, regardless of the pre-charge potential. In the present invention, no clamping circuit for clamping the bit lines to the pre-charge voltage is employed, and a smooth operation can still be attained. With no clamping operation to be performed, no circuit for generating the pre-charge voltage is required. Thus, both the power consumption and the circuit area can be dramatically reduced.

The above objects of the present invention are also achieved by a semiconductor memory device which includes: bit lines in pairs; a sense amplifier connected to each pair of the bit lines; a first memory cell that is connected to one bit line of each pair of the bit lines; a second memory cell that is connected to the other bit line of each pair of the bit lines and stores the inverted data of the data stored in the first memory cell; a word line connected to every other pair of the bit lines; an open-close column gate that connects the bit lines to a data bus; and a control circuit that opens the column gate before the sense amplifier is activated in a data write operation.

In this semiconductor memory device, during a data write operation, data is written onto the bit lines before the data from the memory cell that appears on the bit lines is amplified. More specifically, before the sense amplifier is activated during a data write operation, the column gate is opened. In the semiconductor memory device of the twin-storage type of the present invention, when a word line is activated, there is a bit line, on which no data appears, between each two adjacent bit lines, on which data appears. In such a structure, the bit lines having no data appearing thereon functions as shields, so that the data on the adjacent bit lines have no adverse influence on each other due to capacity coupling. Accordingly, even if data is written onto the bit lines before the bit lines are latched by the sense amplifier (before the data is amplified), each two adjacent sets of data can be prevented from damaging each other by virtue of the shield effect of the bit lines. In this manner, the speed of the data write operation can be increased.

The above objects of the present invention are also achieved by a semiconductor memory device which includes: bit lines in pairs; a sense amplifier that is connected to each pair of the bit lines; a first memory cell that is connected to one bit line of each pair of the bit lines; a second memory cell that is connected to the other bit line of each pair of the bit lines and stores the inverted data of the data stored in the first memory cell; and a control circuit that controls the sense amplifier to start a pull-down operation after starting a pull-up operation.

In this semiconductor memory device, the sense amplifier is controlled so as to start a pull-down operation after starting a pull-up operation. In a semiconductor memory device of a twin-storage type, a refresh time is normally long, and therefore the potential of the data of the memory cells is low during a data read operation onto the bit lines when data is read out by a pull-down operation from a low potential, there is not enough margin below the potential. As a result, the pull-down operation might fail or take a long period of time. According to the present invention, the pull-up operation is performed before the pull-down operation, so as to realize a steady and prompt latch operation by the sense amplifier. Thus, a high-speed data read operation can be performed.

The above objects of the present invention are also achieved by a semiconductor memory device which includes: bit lines in pairs; a sense amplifier that is connected to each pair of the bit lines; a word line; a first memory cell that is connected to one bit line of each pair of the bit lines when the word line is activated; a second memory cell that is connected to the other bit line of each pair of the bit lines when the word line is activated, and stores the inverted data of the data stored in the first memory cell; and a control circuit that activates the word line at a first potential during a first period, and then activates the word line at a second potential higher than the first potential during a second period that comes after the first period.

In this semiconductor memory device, the word line is activated at the first potential during the first period, and at the second potential during the second period. In a semiconductor memory device of a twin-storage type, each charge accumulated in the two memory cells changes the potentials of the two bit lines. Even if high-level data is not read out, low-level data pulls down the potential of the other bit line, thereby performing a data read operation. According to the present invention, when data is read out from the memory cells onto the bit lines (the first period), a potential that has not been boosted is used as a word line potential, thereby reducing the power consumption. Such a potential that has not been boosted is sufficient to switch on the cell transistor on the memory cell storing the low-level data. With such a potential, the potential of the other bit line can be pulled down with no trouble, and a data read operation can be smoothly performed. Also, when data is written from the bit lines into the memory cells (the second period), a boosted potential is used to perform an accurate and high-speed data write operation.

The above and other objects and features of the present invention will become more apparent from the following description taken in conjunction with the accompanying drawings.

DESCRIPTION OF THE PREFERRED EMBODIMENTS

The following is a description of embodiments of the present invention, with reference to the accompanying drawings.

Figure 1:
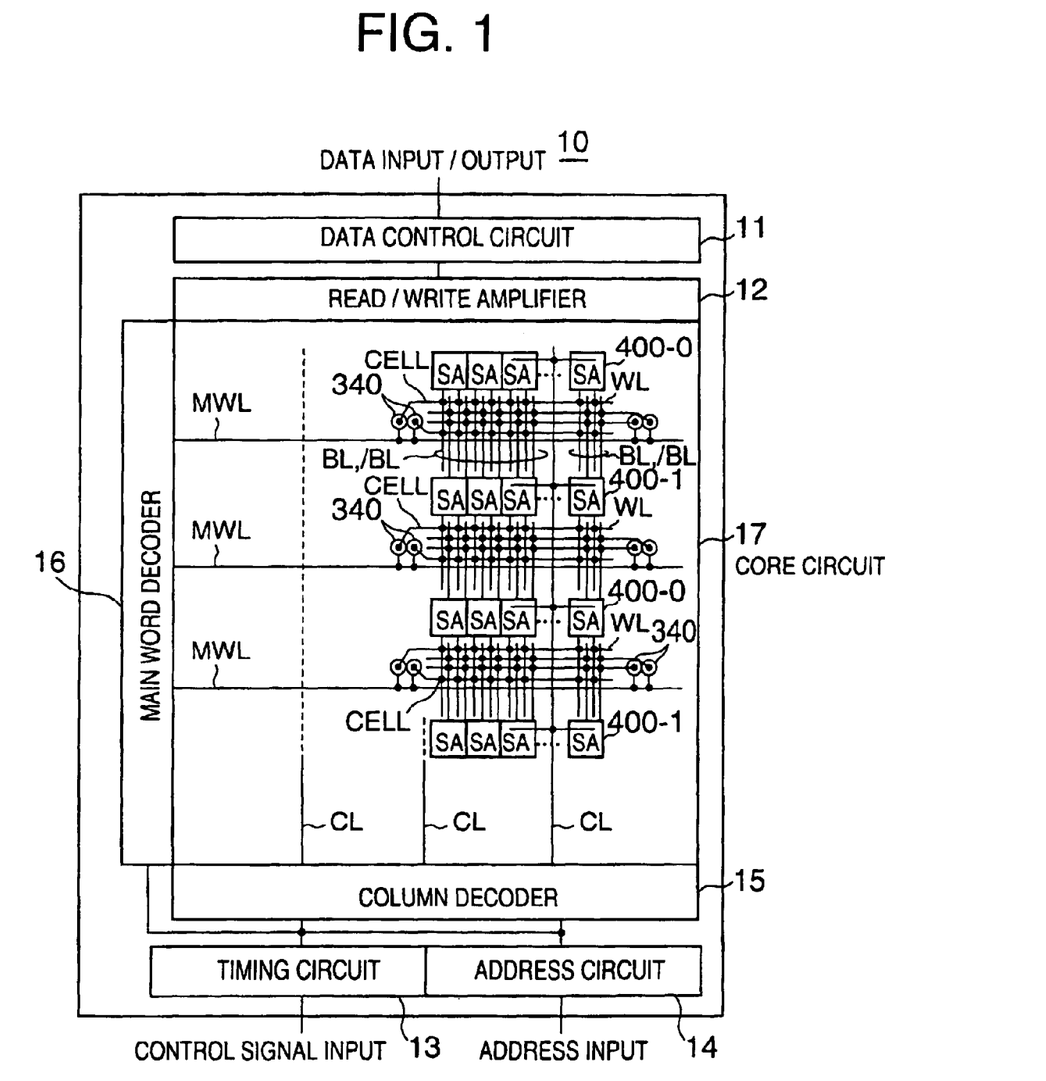
FIG. 1 shows a semiconductor memory device to which the present invention is applied.

FIG. 1 shows a semiconductor memory device in accordance with the present invention.

A semiconductor memory device 10 shown in FIG. 1 comprises a data control circuit 11, read/write amplifier 12, a timing circuit 13, an address circuit 14, a column decoder 15, a main word decoder 16, and a core circuit 17.

The core circuit 17 has a plurality of cells arranged vertically and horizontally, and is provided with circuits and wires for designating addresses and amplifying data for reading and writing 1-bit data for each of the cells. The cores circuit 17 shown in FIG. 1 comprises a plurality of sense amplifier units 400-0 and 400-1, a plurality of sub word decoders 340, a plurality of word lines WL, a plurality of main word lines MWL, and a plurality of column lines CL.

The data control circuit 11 is made up of a group of circuits such as data buffers, and supplies data written from the outside to the read/write amplifier 12 at suitable timing. Also, the data control circuit 11 outputs data read out from the core circuit 17 and the read/write amplifier 12 to the outside at suitable timing. The read/write amplifier 12 amplifies write data and supplies the amplified data to the core circuit 17, and amplifies read data supplied from the core circuit 17.

The timing circuit 13 is made up of a group of circuits such as a control signal buffer and a command decoder. The timing circuit 13 receives a control signal and a clock signal from the outside, and interprets a command indicated by the control signal, thereby controlling the operations and timing of each circuit in the semiconductor memory device 10.

The address circuit 14 is made up of a group of circuits such as an address buffer and an address pre-decoder. The address circuit 14 receives an address signal from the outside and supplies an address to the column decoder 15 and the main word decoder 16 at suitable timing.

The column decoder 15 decodes a column address supplied from the address circuit 14, and activates one of the column lines CL corresponding to the column address. Also, the main word decoder 16 decodes a row address supplied form the address circuit 14, and activates one of the main word lines MWL corresponding to the row address. In FIG. 1, a hierarchical word decoding method is employed. According to this method, one of the word lines WL corresponding to one main word line MWL selected by the main word decoder 16 is selectively activated by the corresponding sub word decoder 340.

In a read operation, data is read out from the cell connected to the activated word line WL, and the read data is amplified by the sense amplifier units 400-0 or 400-1. The amplified data is then read out from the sense amplifier unit corresponding to the activated column line CL, and supplied to the read/write amplifier 12. In a write operation, on the contrary, data is supplied from the read/write amplifier 12 to one of the sense amplifier units selected by the activated column line CL, and the data from the selected sense amplifier unit is then written in the cell connected to the activated work line WL.

The semiconductor memory device 10 shown in FIG. 1 is a twin-storage type memory in which one memory cell is connected to each of a pair of bit lines BL connected to one sense amplifier unit, and the inversed data of the data stored in one of the memory cells is stored in the other one of the memory cells.

Figure 2:
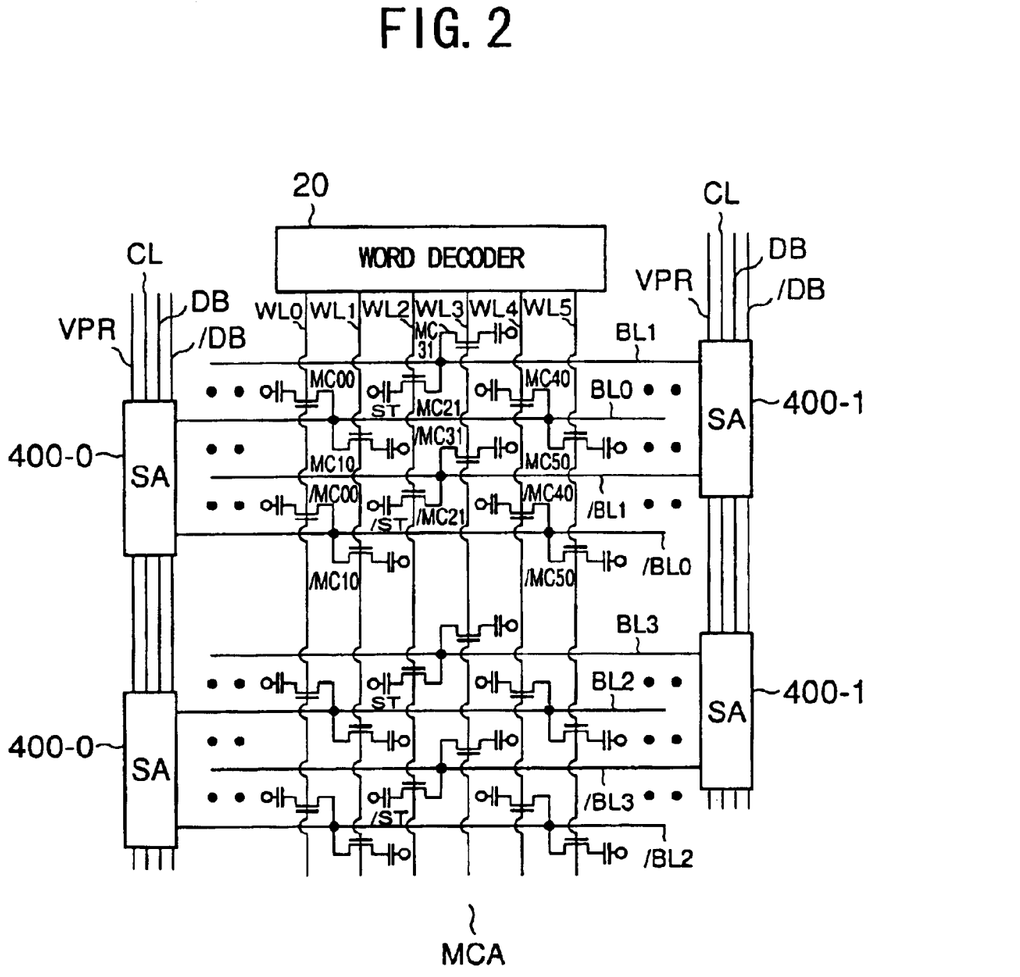
FIG. 2 shows the fundamental structure of a core circuit of a twin-storage type memory.

FIG. 2 shows the structure of the core circuit 17 of a twin-storage type memory.

The structure shown in FIG. 2 comprises a word decoder 20, the sense amplifier units 400-0 and 400-1, bit lines BLn and /BLn (n=1, 2, 3, . . . ), word lines WL0 to WL5, and memory cell units MCxy and /MCxy made up of transistors and capacitors. The word decoder 20 collectively indicates the sub word decoders 340 shown in FIG. 1. The slash marks "/" indicates logical inversion.

As shown in FIG. 2, when the word line WL0 is activated, for instance, the data of the memory cell unit MC00 appears on the bit line BL0, and the data of the memory cell unit /MC00 appears on the bit line /BL00. For instance, if high-level data is stored in the memory cell unit MC00, low-level data is stored in the memory cell unit /MC00. Accordingly, the potential of the bit line BL0 shifts toward the high level, while the potential of the bit line /BL0 shifts toward the low level. The potential difference caused here is amplified by the sense amplifier unit 400-0 connected to the bit line BL0 and /BL0. The amplifier data is supplied to data buses DB and /DB by activating the column line CL connected to the sense amplifier unit 400-0.

In the twin-storage type memory, a data readout operation can be more steadily performed than in a case where a memory cell is connected to only one of a pair of bit lines like a normal DRAM. Accordingly, a refresh cycle can be made longer.

A twin-storage type memory of the present invention has a structure in which the bit lines are alternately connected to different sense amplifier units. More specifically, the bit line BL1 shown at the top in FIG. 2 is connected to a sense amplifier unit 400-1, the bit line BL0 immediately below the bit line BL1 is connected to a sense amplifier unit 400-0, and the bit line /BL1 immediately below the bit line BL1 is connected to the sense amplifier unit 400-1. In this manner, the sense amplifier units 400-0 are connected to the bit lines of even numbers, while the sense amplifier units 400-1 are connected to the bit lines of odd numbers.

Furthermore, the bit lines of even numbers ("n" is even numbers) are connected to memory cells selected by the word lines WL0, WL1, WL4, WL5, . . . . Likewise, the bit lines of odd numbers ("n" is odd numbers) are connected to memory cells selected by the word lines WL2, WL3, . . . .

This structure is characterized in that the data of the memory cells connected to an activated work line appears on every other bit line. In data read and write operations, when the word line WL0 is activated, for instance, the data of the memory cell connected to the word line WL0 appears on the bit lines of even numbers (BL0, /BL0, BL2, /BL2, . . . ). The data of the bit lines of even numbers are amplified by the sense amplifier units 400-0. Meanwhile, no data appears on the bit lines of odd numbers, which therefore are maintained at a pre-charge potential or a lower potential that has been lowered by discharging.

In this structure, adverse influences on data due to the coupling between adjacent bit lines, i.e., capacity coupling, can be minimized.

In a conventional DRAM structure, when one word line activated, the data of one of two adjacent memory cells connected to the activated word line appears on the bit line BLm, and the data of the other one of the two adjacent memory cells appears on the BLm+1. The bit line BLm+1 is located next to the bit line /BLm corresponding to the inverted data of the bit line BLm. Accordingly, in a write operation, when new data is to be written in the memory cell of the bit line BLm+1 before the bit lines are latched by the sense amplifier units (i.e., before the data is amplified), the data of the bit line/BLm and the bit line BLm are adversely affected by the capacity coupling of the bit line BLm+1 and the bit line /BLm. If the adverse influence from the capacity coupling is too large, the data of the memory cell of the bit line BLm might be destroyed.

On the other hand, in the structure shown in FIG. 2, when one word line is activated, there is always one bit line on which no data appears all the time between bit lines on which data appears. The bit lines having no data appearing thereon serve as shields, so that each two adjacent sets of data do not adversely affect each other due to capacity coupling.

In the structure shown in FIG. 2, in a write operation, new data can be written in the memory cells via the bit lines before the bit lines are latched by the sense amplifier units (i.e., before the data is amplified). In such an operation, each two adjacent sets of data do not adversely affect each other due to capacity coupling, and no data will be destroyed.

Figure 3:
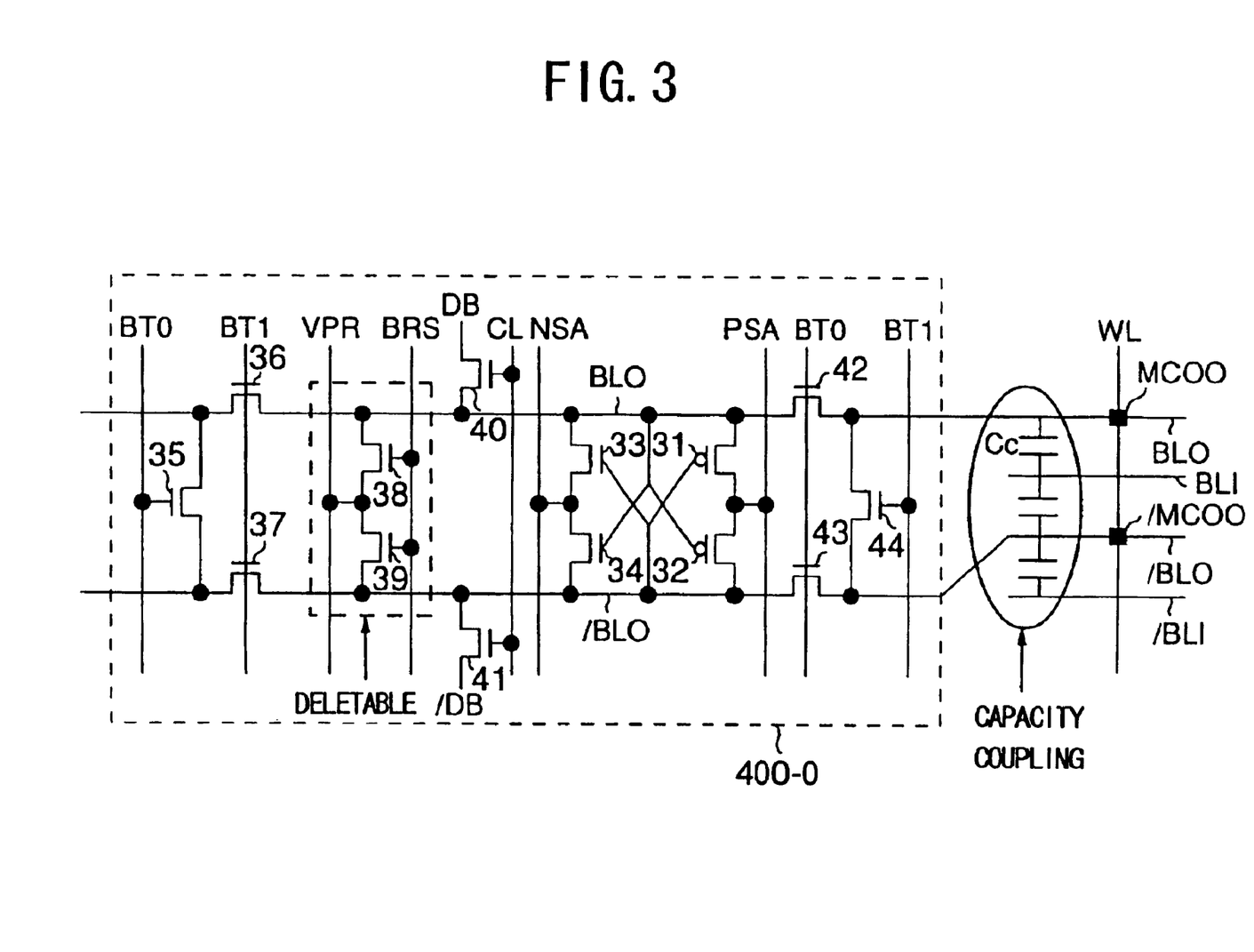
FIG. 3 shows the structure of a sense amplifier unit of the present invention.

FIG. 3 shows the structure of one of the sense amplifier units of the present invention.

The sense amplifier unit 400-0 shown in FIG. 3 comprises PMOS transistors 31 and 32 and the NMOS transistors 33 to 44. In the sense amplifier unit 400-0, the PMOS transistors 31 and 32 and the NMOS transistors 33 and 34 constitute a sense amplifier. When a signal PSA becomes high and a signal NSA becomes low, the data appearing on the bit lines BL0 and /BL0 is amplified. In a read operation, when a column line signal CL becomes high, the data on the bit lines BL0 and /BL0 is read out and supplied to the data buses DB and /DB. In a write operation, when the column line signal becomes high, the data in the data buses DB and /DB is write in the bit lines BL0 and /BL0. The data buses DB and /DB are disposed between the read/write amplifier 12 and the core circuit 17.

Figure 4:
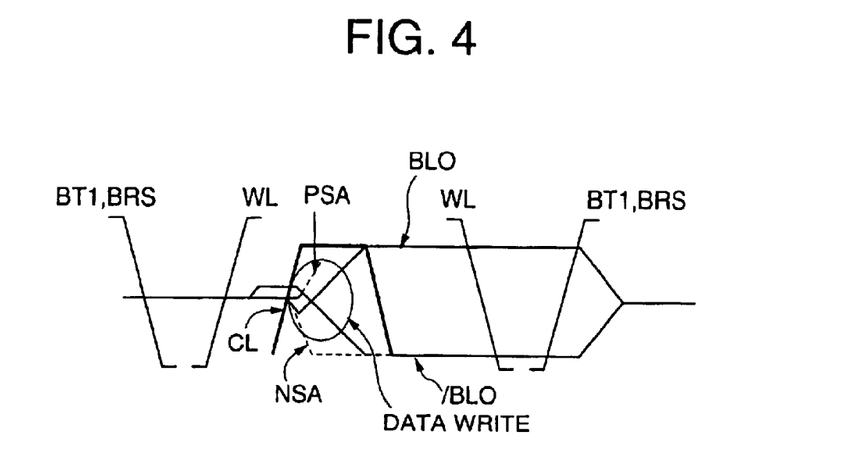
FIG. 4 illustrates an operation of writing data onto bit lines before a latch operation by the sense amplifier unit in the semiconductor memory device of the present invention.

FIG. 4 illustrates an operation to write data on the bit lines before the bit lines are latched by the sense amplifier units in the semiconductor memory device of the present invention.

Referring to FIGS. 3 and 4, the data write operation according to the present invention will now be described. When signals BT1 and BRS switch from the high level to the low level, the bit lines BL0 and /BL0 are separated from each other, and the sense amplifier is detached by the NMOS transistors 36 and 37 shown in FIG. 3. In this manner, the memory cells MC00 and /MC00 are prepared for the data write operation.

When the word line WL becomes high, the data of the memory cells MC00 and /MC00 appear on the bit lines BL0 and /BL0. After that, before the latch operation is started by the sense amplifier (i.e., before the signal PSA becomes high and the signal NSA becomes low), the column line signal CL is switched to the high level. By switching the column line signal CL to the high level, the data of the data buses DB and /DB is written in the bit lines BL0 and /BL0. Since the adjacent bit lines BL1 and /BL1 are not connected to the sense amplifier and the memory cells, the data will not be destroyed by the adverse influence of the capacity coupling between the bit lines. After the column line signal CL is switched to the high level, the signal PSA is switched to the high level and the signal NSA is switched to the low level.

By doing so, the data written in the bit lines BL0 and /BL0 is amplified by the sense amplifier. The amplified data is then written in the memory cells MC00 and /MC00. After that, the word line signal WL is switched to the low level, thereby completing the data write operation into the memory cells.

In a conventional operation, to prevent data to the data due to the capacity coupling between adjacent bit lines, the data write operation onto the bit lines is performed after the latch operation is performed by the sense amplifier. On the contrary, according to the present invention, the data write operation can be performed on the bit lines before the latch operation by the sense amplifier. Accordingly, the write operation is performed at the operation timing of the present invention so as to realize a high-speed data write operation in a semiconductor memory device.

Figure 5:
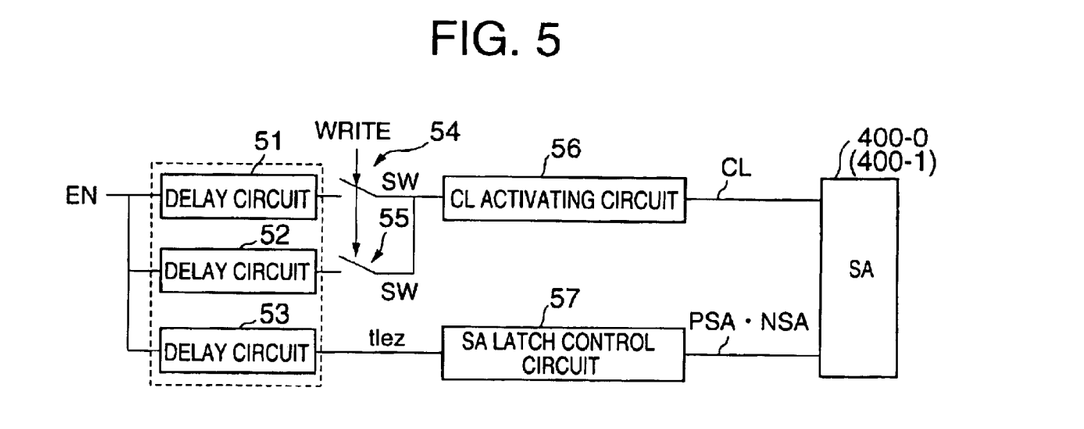
FIG. 5 illustrates the structure of a control circuit that performs a data write operation onto bit lines before the latch operation by the sense amplifier in accordance with the present invention.

FIG. 5 shows the structure of a control circuit that performs a data write operation onto the bit lines before the latch operation is performed by the sense amplifier. The circuit shown in FIG. 5 is equivalent to a part of the timing circuit 13 in the structure shown in FIG. 1.

The control circuit shown in FIG. 5 comprises delay circuits 51 to 53, switches 54 and 55, a column line signal activating circuit 56, and a sense amplifier latch control circuit 57.

A core circuit activating signal EN for activating the core circuit 17 is inputted into the delay circuits 51 to 53. The core circuit activating signal EN is a signal that is activated when a operation such as a data write operation or a data read operation is performed, and generated in the timing circuit 13 in accordance with a control signal supplied from the outside of the semiconductor memory device 10. The delay circuits 51 to 53 have different quantities of delay. More specifically, the delay circuit 51 has the smallest quantity of delay, the delay circuit 52 has the largest quantity of delay, and the delay circuit 53 has the medium quantity of delay.

A write signal WRITE that becomes high in a data write operation is inputted into the switches 54 and 55. When the write signal WRITE becomes high, the switch 54 closes, and the switch 55 opens. Accordingly, in a data write operation, the core circuit activating signal EN is supplied to the column line signal activating circuit 56 via the delay circuit 51. When the write signal WRITE becomes low, the switch 54 opens, and the switch 55 closes. Accordingly, in a data read operation, the core circuit activating signal EN is supplied to the column line signal activating circuit 56 via the delay circuit 52.

The quantity of delay of the delay circuit 51 is smaller than the quantity of delay of the delay circuit 52. Accordingly, the timing at which the core circuit activating signal EN is supplied to the column line signal activating circuit 56 is quicker in a data write operation than in a data read operation. Meanwhile, the quantity of delay of the delay circuit 53 is at the mid-point between the quantity of delay of the delay circuit 51 and the quantity of delay of the delay circuit 52. Accordingly, the timing at which the core circuit activating signal EN is supplied to the sense amplifier latch control circuit 57 is slower than the timing at which the core circuit activating signal EN is supplied to the column line signal activating circuit 56 in a data write operation, but quicker than the timing at which the core circuit activating signal EN is supplied to the column line signal activating circuit 56.

The present invention is applied to the above timing control, while the structures of the delay circuits 51 to 53, the switches 54 and 55, and the others are the same as in the prior art. More specifically, the structures of the column line signal activating circuit 56 and the sense amplifier latch control circuit 57 are the same as in the prior art. The column line signal activating circuit 56 generates the column line signal CL in synchronization with the timing at which the column line signal activating circuit 56 receives the core circuit activating signal EN. The generated column line signal CL is then supplied to one of the sense amplifier units 400-0 (or 400-1). The sense amplifier latch control circuit 57 generates the sense amplifier activating signals PSA and NSA in synchronization with the timing at which the sense amplifier latch control circuit 57 receives the core circuit activating signal EN, and supplies the generated sense amplifier activating signals PSA and NSA to one of the sense amplifiers units 400-0 (or 400-1).

By the above timing control in accordance with the present invention, in a data read operation, the signals PSA and NSA are activated to prompt the sense amplifier to start a latch operation, the column line signal CL is activated to read out the data on the bit lines into the data bus. Meanwhile, in a data write operation, the column line signal CL is first activated to write data onto the bit lines, and the signals PSA and NSA are then activated to prompt the sense amplifier to start the latch operation. Thus, the data write operation can be speeded up.

Figure 6:
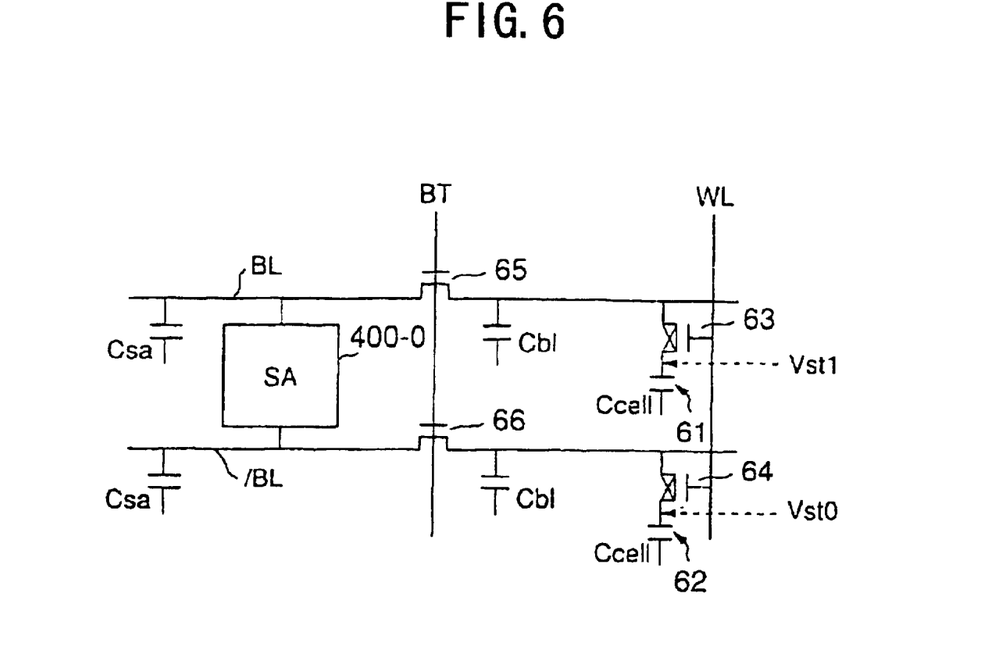
FIG. 6 illustrates a potential difference between bit lines in a data read operation.

Referring now to FIG. 6, another embodiment of the semiconductor memory device of the present invention will be described. In this semiconductor memory device, the potential difference between the bit lines in the data read operation does not depend on the pre-charge level.

As shown in FIG. 6, bit lines BL and /BL are connected to a sense amplifier unit 400-0. A memory cell 61 is connected to the bit line BL via a transistor 63, while a memory cell 62 is connected to the bit line /BL via a transistor 64. On the left side of transfer gates 65 and 66, the bit lines BL and /BL each have a capacity Csa. On the right side of the transfer gates 65 and 66, the bit lines BL and /BL each have a capacity Cbl. The capacity of each of the memory cells 61 and 62 is indicated as Ccell in FIG. 6.

The charge equivalent to a potential Vst1 is accumulated in the memory cell 61, and the charge equivalent to a potential Vst0 is accumulated in the memory cell 62.

When the word line WL becomes high, the potential difference between the bit lines BL and /BL can be expressed by a potential $\Delta Vb1$ as in the following equation:

$$\Delta Vb1 = Ccell(Vst1-Vst0)/(Ccell+Csa+Cb1) \qquad (1)$$

As can be seen from the equation (1), the potential difference Vb1 between the bit lines BL and /BL depends only on the potential difference between the two memory cells 61 and 62, and has no relation to the pre-charge potential of the bit lines BL and /BL.

In a case of a conventional single-storage type, instead of the twin-storage type, the transistor 64 and the memory cell 62 shown in FIG. 6 do not exist. In such a case, the potential difference $\Delta Vb1$ between the bit lines BL and /BL is expressed as:

$$\Delta Vb1 = Ccell(Vst-Vpr)/(Ccell+Csa+Cb1) \qquad (2)$$

Here, the potential Vpr is the pre-charge potential of the bit line. In this manner, in the case of a single-storage type, the potential difference between the bit lines depends on the pre-charge potential.

In the semiconductor memory device of the present invention, the potential difference between the bit lines does not depend on the pre-charge potential. Accordingly, the pre-charge potential to be supplied to the sense amplifier units 400-0 (400-1) can be arbitrarily set. For instance, in the sense amplifier unit 400-0 shown in FIG. 3, the sensitivity of the VPR generating circuit can be made low, so that the value of VPR can be more freely set at a low value. The power consumption by the semiconductor memory device 10 can be greatly reduced. In an extreme case, a clamping circuit (a circuit part made up to of the NMOS transistors 38 and 39) that clamps the voltage on the bit lines to the pre-charge voltage may be eliminated from the sense amplifier unit 400-0 shown in FIG. 3. In such a case, since the process of clamping the bit lines to the pre-charge voltage itself is no longer required, the circuit for generating the pre-charge voltage are also unnecessary. Thus, the power consumption and the circuit area can be greatly reduced.

More specifically, as shown in FIG. 3, a normal sense amplifier unit comprises the sense transistors 31 to 34, the equalizing transistors 35 and 44, the bit line transfer gates 36, 37, 42, and 43, the column gates 40 and 41, and the transistors 38 and 39 that constitute the clamping circuit. In the present invention, the pre-charge voltage Vpr to be supplied to the clamping circuit is set at a low value so as to reduce the overall power consumption of the semiconductor memory device 10 or to eliminate the clamping circuit (i.e., the transistors 38 and 39) itself. In the latter case, the sense amplifier unit is left with the sense transistors 31 to 34, the equalizing transistors 35 and 44, the bit line transfer gates 36, 37, 42, and 43, and the column gates 40 and 41. Thus, the power consumption and the circuit area are both greatly reduced.

Figure 7:
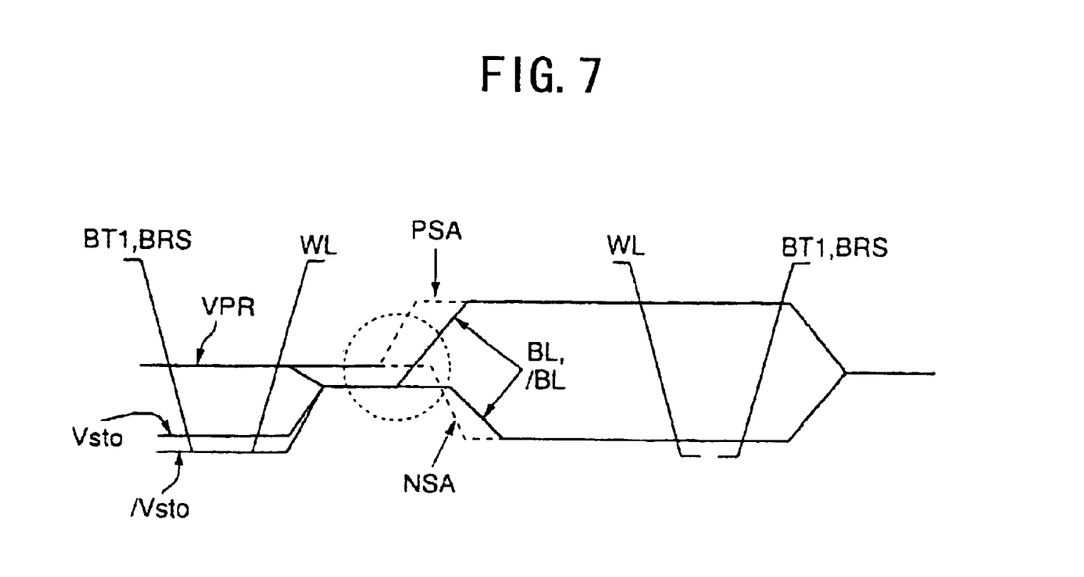
FIG. 7 illustrates a data read operation onto bit lines from memory cells.

FIG. 7 shows yet another embodiment of the semiconductor memory device of the present invention in which an accurate and high-speed data read operation can be performed.

Referring to FIGS. 3 and 7, a data read operation in accordance with the present invention will now be described. When signals BT1 and BRS switch from the high level to the low level, the bit lines BL0 and /BL0 are separated from each other, and a sense amplifier is detached from the left-side bit line portion by the NMOS transistors 36 and 37 in FIG. 3. In this manner, a preparation is made for data reading from the memory cells to the bit lines.

When the word line WL switches to the high level, the data of the memory cells MC00 and /MC00 appear on the bit lines BL0 and /BL0. Here, the potential held by the memory cell MC00 is Vst0, while the potential held by the memory cell /MC00 is /Vst0.

In a semiconductor memory device of a twin-storage type, a steady data read operation can be performed, compared with a case where a memory cell is connected to only one of a pair of bit lines. Such a semiconductor memory device is characterized by long refresh cycles. Accordingly, at a point where the data of the memory cells are read out onto the bit lines, the high-level potential Vst0 held by the memory cell MC00 is very low, as shown in FIG. 7. In such a case, even if the pre-charge voltage VPR is a voltage at a mid-point between the high level and the low level, the potentials of the bit lines are pulled down by the potentials of the memory cells when the data of the memory cells appear on the bit lines. As a result, the potentials of the bit lines become lower than the mid-point potential between the high level and the low level.

In the prior art, a pull-down operation of the sense amplifier is performed before a pull-up operation. This is because the threshold value of the NMOS transistor for a pull-down operation is smaller than the threshold value of the PMOS transistor for a pull-up operation. In the case shown in FIG. 7, however, since the potentials of the bit lines become lower after the data read-out onto the bit lines, a pull-down operation should not be performed before a pull-up operation. If a low potential is pulled down, it is difficult to switch the pull-down NMOS transistors (33 and 34 in FIG. 3) on, because there is not a wide enough margin. As a result, the pull-down operation is failed, or takes a long period of time.

In the semiconductor memory device of the present invention, a latch operation by the sense amplifier (i.e., a pull-up operation and a pull-down operation) is started at a low voltage. Therefore, a pull-up operation should be performed before a pull-down operation, as shown in FIG. 7. In this manner, the lath operation by the sense amplifier can be surely performed at high speed. Thus, a high-speed read operation can be realized.

Figure 8:
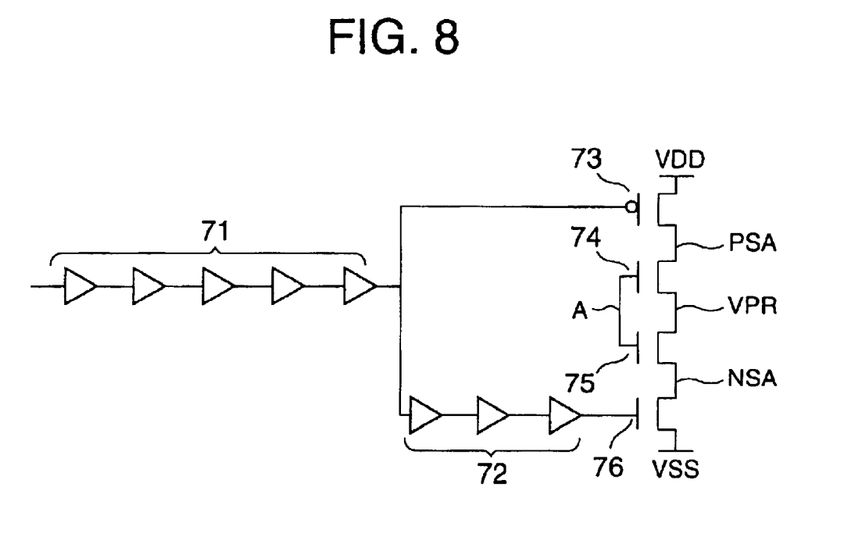
FIG. 8 is a circuit diagram of a sense amplifier latch control circuit that performs a pull-up operation before a pull-down operation.

FIG. 8 is a circuit diagram of the sense amplifier latch control circuit that performs a pull-up operation before a pull-down operation.

The sense amplifier latch control circuit shown in FIG. 8 comprises a plurality of delay units 71, a plurality of delay units 72, a PMOS transistor 73, and NMOS transistors 74 to 76. This circuit is equivalent to a part of the timing circuit 13 in the structure shown in FIG. 1.

When a core circuit activating signal TLEN is supplied in the same manner as with the core circuit activating signal but at different timing, the PMOS transistor 73 is continued after a propagation time corresponding to a delay time of the plurality of delay units 71. The sense amplifier activating signal PSA for a pull-up operation then becomes high, thereby performing the pull-up operation. After that, the NMOS transistor 75 is continued after a propagation time corresponding to the delay time of the plurality of delay units 72. As a result, the sense amplifier activating signal NSA for a pull-down operation becomes low, and the pull-down operation is performed. A signal A is a selection signal that becomes VSS at the time of selecting a corresponding sense amplifier.

By employing the circuit of FIG. 8, a pull-up operation can be performed before a pull-down operation. Thus, a prompt latch operation by the sense amplifier can be surely performed, thereby speeding up a data read operation.

Next, as still another embodiment of the semiconductor memory device of the present invention, a structure in which the power consumption can be reduced by controlling a word line activating potential will be described below.

In a case where a memory cell is connected to only one of a pair of bit lines as in a case of a conventional DRAM, the potential at the time of activating the word line is set at a potential VPP (3.7 V, for instance) boosted from an external power source voltage VDD (2.5 V, for instance). With the threshold voltage of a cell transistor being taken into consideration, the voltage to be supplied to the gate of the cell transistor should be sufficiently higher than the pre-charge potential so as to prevent an access delay in a high-level data read operation that is performed on the memory cell. In a case where data is written in the memory cell (in a data write operation or a data restoring operation after a data read operation), to write the high-level potential (2.0 V, for instance) of the bit lines, a potential to be supplied to the gate of the cell transistor needs to be set sufficiently higher than the high-level potential of the bit lines.

In a semiconductor memory device of a twin-storage type, on the other hand, each charge accumulated in two memory cells changes each potential of the two bit lines. More specifically, even if the high-level data cannot be read out, the potential of the other bit line can be pulled down by the low-level data. In a data read operation, it is not necessary to set the potential to be supplied to the gate of the cell transistor at a boosted potential that is higher than the high-level potential, and an non-boosted potential sufficiently serves. In other words, a potential that has not been boosted sufficiently serves to turn on the cell transistor on the side of the memory cell storing the low-level data. Thus, the potential of the other bit line can be pulled down, and the data read operation can be performed.

However, when data is written in a memory cell (in a data write operation or a data restoring operation after a data read operation), it is necessary to set the potential to be supplied to the gate of the cell transistor at a boosted potential. Accordingly, the potential to be supplied to the gate of the cell transistor (the word line activating potential) should be set at a regular high-level potential when data is read out from a memory cell onto a bit line, and at a boosted high-level potential when data is written from a bit line into a memory cell. In other words, it is necessary to change the word line activating potential from a regular potential to a boosted potential in a stepwise manner.

Figure 9:
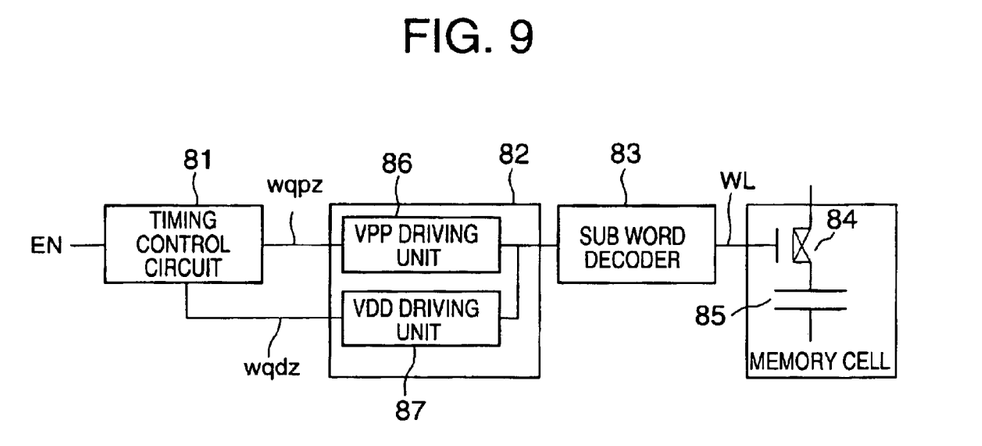
FIG. 9 shows the structure of a circuit that changes an activating potential from a regular potential to a boosted potential in a stepwise manner.

FIG. 9 shows the structure of a circuit that changes the word line activating potential from a regular potential to a boosted potential in a stepwise manner.

The circuit shown in FIG. 9 comprises a timing control circuit 81, a driving circuit 82, a sub word decoder 83, a cell transistor 84, and a cell capacitor 85. The driving circuit 82 comprises a VPP driving unit 86 that drives the sub word decoder 83 at a boosted potential, and a VDD driving unit 87 that drives the sub word decoder 83 at a regular potential. The circuit shown in FIG. 9 is equivalent to a part of the timing circuit 13 in the structure shown in FIG. 1 and a part of a circuit concerning a word decoder.

The timing control circuit 81 receives a core circuit activating signal EN, and outputs a boosted potential driving signal wqpz and a regular potential driving signal wqdz. The boosted potential driving signal wqpz and a regular potential driving signal wqdz are supplied to the VPP driving unit 86 and the VDD driving unit 87, respectively. The driving unit 82 drives the sub word decoder 83 with a boosted voltage or a regular voltage. The sub word decoder 83 activates the word line WL with a boosted voltage or a regular voltage supplied as a driving voltage. As the word line WL is activated, the cell transistor 84 is energized to connect the cell capacitor 85 and the bit line.

Figure 10:
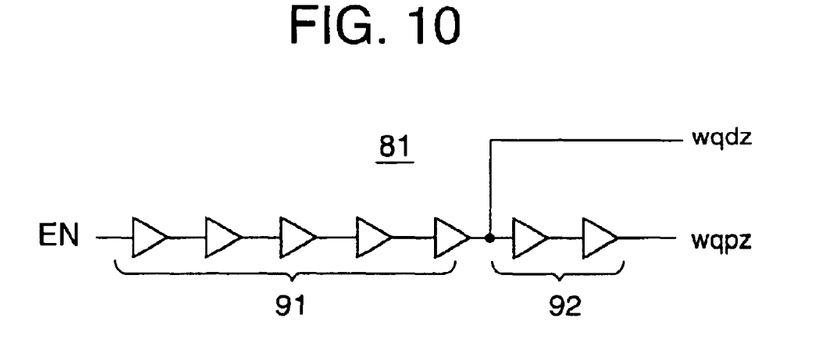
FIG. 10 shows the circuit structure of the timing control circuit shown in FIG. 9.

FIG. 10 shows the structure of the timing control circuit 81. The timing control circuit 81 comprises a plurality of delay units 91 and a plurality of delay units 92. The timing control circuit 81 receives a high-level core circuit activating signal EN, and then outputs a high-level regular potential driving signal wqdz after a propagation time equal to the delay time of the plurality of delay units 91. The timing control circuit 81 further outputs a high-level boosted potential driving signal wqpz after a propagation time equal to the delay time of the plurality of delay units 92.

Figure 11:
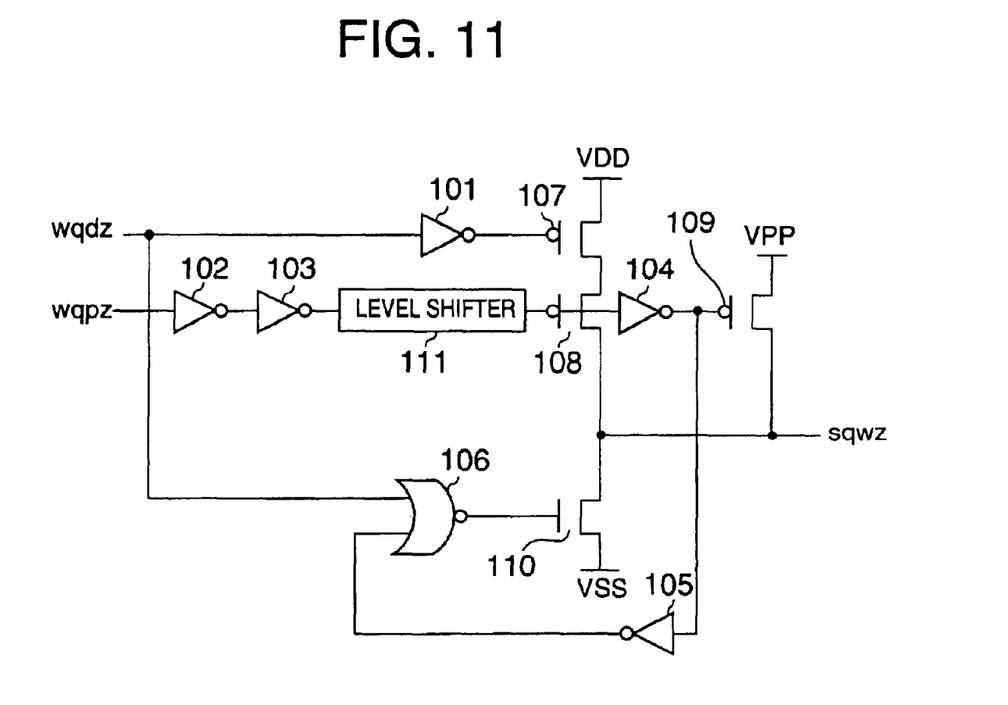
FIG. 11 shows the circuit structure of the driving circuit shown in FIG. 9.

FIG. 11 shows the structure of the driving circuit 82. The driving circuit 82 comprises inverters 101 to 105, a NOR circuit 106, PMOS transistors 107 to 109, a NMOS transistor 110, and a level shifter circuit 111. The level shifter circuit 111 converts a VDD-level input into a VPP-level output of the same logic. Here, the VDD is the regular voltage (not boosted), while the VPP is the boosted voltage.

When the regular potential driving signal wqdz becomes high, the PMOS transistor 107 is turned on. At this point, the boosted potential driving signal wqpz remains low, and the output of the level shifter circuit 111 is low. The PMOS transistor 108 is on. Also, since the output of the NOR circuit 106 is low, the NMOS transistor 110 is off. Furthermore, as the output of the inverter 104 is high, the PMOS transistor 109 is off. Accordingly, the potential VDD is outputted as a driving signal sqwz.

When the boosted potential driving signal wqpz becomes high, the output of the level sifter circuit 111 also becomes high, and the PMOS transistor 108 is switched off. Since the output of the NOR circuit 106 still remains low, the NMOS transistor 110 is off. Also, since the output of the inverter 104 is low, the PMOS transistor 109 is on. Accordingly, the potential VPP is outputted as the driving signal sqwz.

Even if the regular potential driving signal wqdz returns to the low level, the NMOS transistor 110 remains switched off by the high-level output of the inverter 105, because the output of the inverter 104 is low. Accordingly, the potential VPP is outputted as the driving signal sqwz.

Further, when the boosted potential driving signal wqpz returns to the low level, the NMOS transistor 110 is turned on, as the PMOS transistor 109 is turned off. Accordingly the driving signal sqwz becomes a ground potential.

In the above manner, the driving signal sqwz starts from the ground potential, changes to the potential VDD and then to the potential VPP, and returns to the ground potential at the end.

Figure 12:
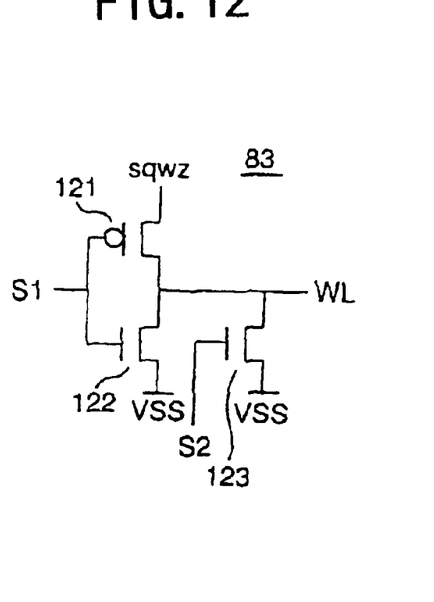
FIG. 12 is a circuit diaphragm showing the circuit structure of the sub word decoder shown in FIG. 9.

FIG. 12 is a circuit diagram showing the circuit structure of the sub word decoder 83. The sub word decoder 83 comprises a PMOS transistor 121, and NMOS transistors 122 and 123. Signals S1 and S2 are address signals that selects one from a plurality of sub word decoders 83. When selecting the specific sub word decoder 83 shown in FIG. 12, the signals S1 and S2 are low. When the sub word decoder 83 shown in FIG. 12 is selected, the PMOS transistor 121 is switched on, and the NMOS transistors 122 and 123 are switched off. Accordingly, the driving signal sqwz supplied from the driving circuit is supplied to the word line WL as the word line activating potential.

In this structure, the potential of the word line WL starts from the ground potential, changes to the potential VDD and then to the potential VPP, and finally returns to the ground potential.

Figure 13:
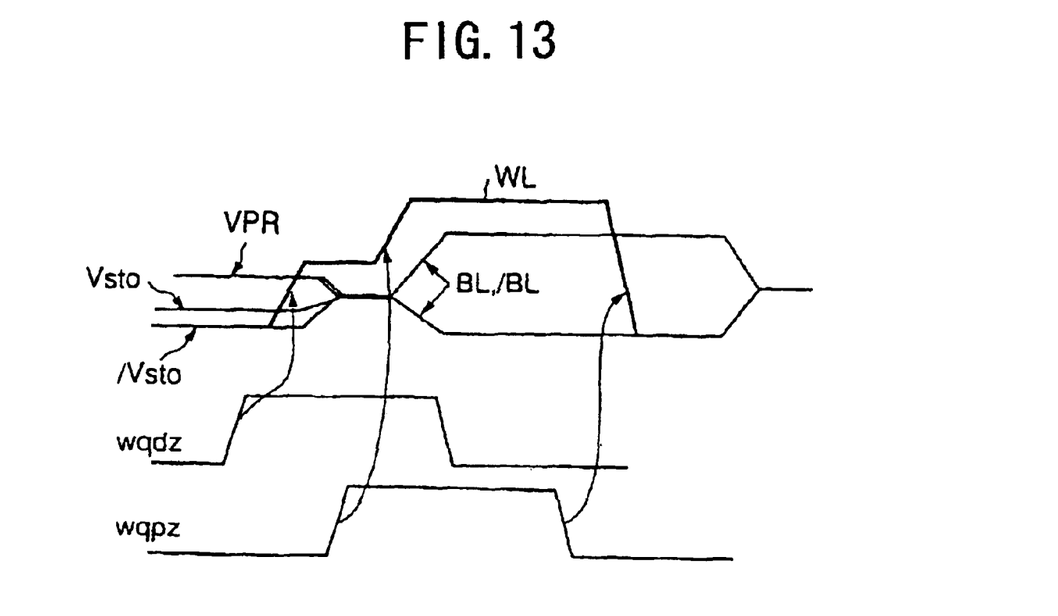
FIG. 13 shows changes in the word line potential that changes stepwise.

FIG. 13 illustrates changes in the word line potential that changes stepwise.

In FIG. 13, a potential Vst0 is held by one of a pair of memory cells, and a potential /Vst0 is held by the other one of the pair of memory cells. The potential of the word line WL first becomes a regular high-level potential VDD in response to a rise of the regular potential driving signal wqdz, and then becomes a boosted potential VPP in response to a rise of the boosted potential driving signal wqpz. In this manner, when data is written (or restored) from a bit line into a memory cell, an accurate and high-speed data write operation can be performed with the boosted potential VPP, and when data is read out from a memory cell onto a bit line, the regular high-level potential VDD is used so as to reduce the power consumption in the semiconductor memory device.

As described above, when data is read out from a memory cell onto a bit line, a potential that has not been boosted can sufficiently serve to switch on the cell transistor on the side of the memory cell storing low-level data. Accordingly, the potential of one of the bit lines is pulled down, so that the data read operation can be performed without any trouble.

The present invention is not limited to the specifically disclosed embodiments, but variations and modifications may be made without departing from the scope of the present invention.

The present application is based on Japanese priority application No. 2000-054831, filed on Feb. 29, 2000, the entire contents of which are hereby incorporated by reference.

What is claimed is:

1. A semiconductor memory device comprising:
   a pair of bit lines;
   another bit line arranged parallel to and between the pair of bit lines;
   a pair of memory cells selected simultaneously, wherein one of the memory cells is coupled to one of the pair of bit lines and stores data, and the other of the memory cells is coupled to the other of the pair of bit lines and stores inverted data;
   a word line coupled in common to the pair of memory cells;
   a sense amplifier configured to amplify data on the pair of bit lines from the pair of memory cells in a read operation and to amplify data on the pair of bit lines to store the data in the pair of memory cells in a write operation;
   a column gate configured to couple the bit lines to a data bus; and
   a control circuit configured to turn ON the column gate before the sense amplifier is activated in the write operation,
   wherein no data is transferred on the another bit line when the sense amplifier is activated.

2. A semiconductor memory device comprising:
   a plurality of word lines;
   first and second pairs of bit lines, bit lines of the first pair and bit lines of the second pair being alternately disposed;
   a plurality of pairs of memory cells, wherein the memory cells of each pair of memory cells are cooled in common to a corresponding one of the plurality of word lines for each pair of memory cells, one of the memory cells is coupled to one of a corresponding one of the first pair of bit lines and the second pair of bit lines and stores data, and the other of the memory cells is coupled to the other of the corresponding one of the first pair of bit lines and the second pair of bit lines and stores inverted data;
   a first sense amplifier and a second sense amplifier, the first sense amplifier amplifying data on the first pair of bit lines to store the data in a selected pair of memory cells in a write operation when the second sense amplifier is not activated and the second sense amplifier amplifying data on the second pair of bit lines to store the data in a selected pair of memory cells in the write operation when the first sense amplifier is not activated so that the second pair of bit lines becomes shield lines when the first sense amplifier is activated;
   a column gate configured to couple the first and second pairs of bit lines, which is coupled to the selected memory cell, to a data bus; and
   a control circuit configured to turn ON the column gate before the first sense amplifier or the second sense amplifier is activated in the write operation.

3. The semiconductor memory device as claimed in claim 2, wherein the control circuit comprises:
   a column gate activating circuit configured to turn ON the column gate in response to an enable signal; and
   a timing circuit configured to output the enable signal, wherein an output timing of the enable signal is controlled by an operation mode signal.

4. The semiconductor memory device as claimed in claim 3, wherein the output timing of the enable signal in a write operation mode precedes that in a read operation mode.

5. The semiconductor memory device as claimed in claim 2, wherein the second pair of bit lines become shield lines when the first sense amplifier is activated.

6. A semiconductor memory device comprising:
   a pair of bit lines;
   another bit line arranged parallel to and between the pair of bit lines;
   a pair of memory cells selected simultaneously, wherein one of the memory cells is coupled to one of the pair of bit lines and stores data, and the other of the memory cells is coupled to the other of the pair of bit lines and stores inverted data;
   a word line coupled in common to the pair of memory cells;
   a sense amplifier configured to amplify data on the pair of bit lines from the pair of memory cells in a read operation and to amplify data on the pair of bit lines to store the data in the pair of memory cells in a write operation;
   a column gate configured to couple the bit lines to a data bus; and
   a control circuit configured to turn ON the column gate before the sense amplifier is activated in the write operation,
   wherein no data is transferred on the another bit line when the sense amplifier is activated so that the another bit line becomes a shield line when the sense amplifier is activated.

7. A semiconductor memory device comprising:
   first and second pairs of bit lines, bit lines of the first pair and bit lines of the second pair being alternately disposed;
   a plurality of pairs of memory cells, for each pair of memory cells, one of the memory cells is coupled to one of a corresponding one of the first pair of bit lines and the second pair of bit lines and stores data, and the other of the memory cells is coupled to the other of the corresponding one of the first pair of bit lines and the second pair of bit lines and stores inverted data;
   a first sense amplifier and a second sense amplifier, the first sense amplifier amplifying data on the first pair of bit lines to store the data in a selected pair of memory cells in a write operation when the second sense amplifier is not activated and the second sense amplifier amplifying data on the second pair of bit lines to store the data in a selected pair of memory cells in the write operation when the first sense amplifier is not activated so that the second pair of bit lines becomes shield lines when the first sense amplifier is activated;
   a column gate configured to couple the first and second pairs of bit lines, which is coupled to the selected memory cell, to a data bus; and
   a control circuit configured to turn ON the column gate before the first sense amplifier or the second sense amplifier is activated in the write operation,
   wherein said control circuit comprises a column gate activating circuit configured to turn ON the column gate in response to an enable signal, and an output timing of the enable signal in a write operation mode precedes that in a read operation mode.

* * * * *